United States Patent
Mishra et al.

Patent Number: 5,747,838
Date of Patent: May 5, 1998

[54] ULTRA-LOW PHASE NOISE GAAS MOSFETS

[75] Inventors: Umesh Kumar Mishra, Santa Barbara; Steven P. DenBaars, Goleta, both of Calif.

[73] Assignee: The Regents of the University of California, Oakland, Calif.

[21] Appl. No.: 758,240

[22] Filed: Nov. 27, 1996

[51] Int. Cl.[6] .......... H01L 31/0328; H01L 31/0336; H01L 31/072; H01L 31/109
[52] U.S. Cl. .......... 257/192; 257/289; 257/410; 257/411
[58] Field of Search .......... 257/289, 410, 257/192, 411

[56] References Cited

U.S. PATENT DOCUMENTS

| | | | |
|---|---|---|---|
| 4,119,993 | 10/1978 | Hartnagel et al. | 257/289 |
| 4,291,327 | 9/1981 | Tsang | 257/289 |
| 4,745,449 | 5/1988 | Chang et al. | 257/289 |
| 4,843,450 | 6/1989 | Kirchner et al. | 257/289 |
| 5,497,024 | 3/1996 | Shibuya et al. | 257/289 X |

*Primary Examiner*—William Mintel
*Attorney, Agent, or Firm*—Merchant, Gould, Smith, Edell, Welter & Schmidt

[57] ABSTRACT

A gallium arsenide-based field effect transistor has a passivation layer of aluminum oxide below a gallium arsenide channel and aluminum oxide gate oxide layer formed over the channel. The aluminum oxide layers are treated to reduce the density of surface state impurities, particularly arsenic released in the oxide layer as a result of forming the oxide layer. The low surface state gallium arsenide channel has very low phase noise and is suitable for use as a local oscillator in a heterodyne receiver.

25 Claims, 16 Drawing Sheets

| n+ GaAs 200 Å | ~200 |
| AlAs 500 Å | ~202 |
| p GaAs 3E17 1000 Å | ~204 |
| p+ BUFFER 2000 Å | ~198 |
| p+ SUBSTRATE | ~196 |

| LT GaAs 200 Å | ~206 |
| AlAs 500 Å | ~202 |
| n GaAs 3E17 1000 Å | ~208 |
| n+ BUFFER 2000 Å | ~194 |
| n+ SUBSTRATE | ~192 |

| GaAs 200 Å | ~207 |
| AlAs 500 Å | ~202 |
| AlGaAs/InGaP 200 Å | ~209 |
| n GaAs 3E17 1000 Å | ~210 |
| n+ BUFFER 2000 Å | ~194 |
| n+ SUBSTRATE | ~192 |

| $Al_2O_3$ 500 Å  214 | ~202' |
| n GaAs 3E17 1000 Å | ~210 |
| n+ BUFFER 2000 Å | ~194 |
| n+ SUBSTRATE | ~192 |

ULTRA-LOW PHASE NOISE GAAS MOSFETS

STATEMENT AS TO RIGHTS TO INVENTIONS MADE UNDER FEDERALLY SPONSORED RESEARCH AND DEVELOPMENT

This invention was made with Government support under Grant No. F49620-95-10394, awarded by the U.S. Air Force. The Government has certain rights in this invention.

CROSS-REFERENCE TO RELATED APPLICATIONS

This application is related to U.S. patent application Ser. No. 08/757,875, filed Nov. 27, 1996, entitled "Enhancement-Depletion Logic Based on GaAs MOSFETs," by Umesh K. Mishra, et al.; U.S. patent application Ser. No. 08/756,415, filed Nov. 27, 1996, entitled "Enhancement-Depletion Logic Based on Ge MOSFETs," by Umesh K. Mishra, et al.; and U.S. patent application Ser. No. 08/757,281, filed Nov. 27, 1996, entitled "Ultra-Low Phase Noise Ge MOSFETs," by Umesh K. Mishra et al., all of which applications are incorporated by reference herein.

BACKGROUND OF THE INVENTION

1. Field of the Invention

This invention relates to semiconductor amplifiers, and more particularly to a low noise gallium arsenide field effect transistor and a method for manufacturing same.

2. Description of the Prior Art

Silicon chips and circuit families, for example transistor-transistor logic (TTL) and complementary metal-oxide-semiconductor (CMOS), have dominated electronics for many years. Silicon is widely favored as a base material for semiconductor devices because of the ability to produce both semiconducting material (silicon) and insulating material (silicon oxide) with good electrical and mechanical properties. This combination of high quality semiconducting and insulating silicon-based materials has allowed the widespread implementation of planar growth and fabrication technologies which have resulted in the production of large scale integrated circuits. Thus, silicon-based circuit families include devices which are easily fabricated and built and are inexpensive to produce, and have gained wide acceptance in the electronics field. However, silicon-based devices are limited in speed and frequency bandwidth due to the relatively low carrier mobility. Materials having higher carrier mobility would be preferable to silicon for many applications, including telecommunications, and would result in the production of semiconductor devices which are faster and have a larger bandwidth than those currently fabricated using silicon.

Several other materials have been used to create new devices previously unavailable in silicon. One of these materials, gallium arsenide (GaAs) is common in high frequency or high power microwave devices. However, even though gallium arsenide is widely regarded as being a superior material to silicon, for example because of a higher carrier mobility and higher breakdown field, GaAs has captured only a small fraction of the semiconductor device market share. The use of GaAs has been limited, in part, because it has not been possible to grow an insulating layer, such as an oxide layer, on GaAs, where the insulating layer has good electrical and mechanical properties and has, therefore, restricted the large scale integration of GaAs through the use of planar technology. Consequently, reliable, high quality gallium arsenide metal-oxide-semiconductor (MOS) field effect transistors (FETs) having low gate leakage have not been widely available. Low gate leakage in FETs is required for several applications, especially for low phase noise oscillator applications, such as telecommunications.

Local oscillators are required in heterodyne receivers for converting a radio frequency (RF) signal to an intermediate frequency (IF) signal for processing. An ideal local oscillator signal is a pure sinusoid having constant amplitude, period and phase. However, random fluctuations in the amplitude, frequency and phase of these sources introduce uncertainties in the RF signal that is down-converted to the IF. The random fluctuations are caused by the natural thermal noise created by current flow, and are enhanced by any trapping or scattering effects that are present in the transistor of the oscillator circuit. The random fluctuations produce noise on the local oscillator that varies in intensity inversely with offset frequency from the desired oscillator frequency. For this reason the noise is termed "1/f noise". Random fluctuations in the amplitude and phase of the oscillation are generally in quadrature and in a linear system would have equal importance. However, oscillators are inherently large signal devices and stable oscillation only occurs when the device is driven into saturation, i.e.; into the nonlinear regime. Hard saturation limits the amplitude fluctuations that can occur, with the result that amplitude noise tends to be quite low and does not, in general, seriously affect system performance. Phase and frequency fluctuations, however, are not affected by the saturation mechanism and phase noise characteristics can be relatively large and can have serious degrading effects upon system performance. Phase noise often provides the fundamental limitation to the sensitivity and performance of receivers for systems such as radios, radars, certain radiometers, etc. Doppler systems, in particular, are extremely sensitive to phase noise.

Phase noise has been extensively and intensely investigated for a number of years and a large amount of literature has been published on the subject. It is well known that phase noise varies with the active device used for the oscillator. For example, it is known that the phase noise associated with a bipolar transistor oscillator is significantly lower than that of a GaAs metal-semiconductor FET (MESFET) oscillator. Gunn oscillators are also observed to produce reduced phase noise compared to GaAs MESFET oscillators. The reduced phase noise obtained with GaAs Gunn oscillators compared to GaAs MESFET oscillators is particularly interesting since both devices are fabricated from the same semiconductor and are operated at essentially the same electric field magnitude. A satisfactory explanation for this phenomenon has never been presented and it is generally attributed to 'surface states', and other such arguments.

3. What is the motivation for developing low phase noise MISFETS over Gunn devices?

There is a need to develop low phase noise transistors which have the extended frequency bandwidth afforded by high carrier mobility materials, such as GaAs. In addition, there is also a need to fabricate the low phase noise transistors using planar fabrication techniques, such as is used in the manufacture of FETs, in order to maintain high reliability and performance at reduced manufacturing cost. Thus, it is desirable to develop a GaAs-based FET which incorporates an insulating layer for a gate, and which produces phase noise at a level substantially below that normally associated with GaAs MESFETs.

SUMMARY OF THE INVENTION

To minimize the limitations in the prior art described above, and to minimize other limitations that will become apparent upon reading and understanding the present specification, the present invention discloses a gallium arsenide-based field effect transistor having a passivation layer of aluminum oxide below a gallium arsenide channel and an aluminum oxide gate oxide layer formed over the channel. The aluminum oxide layers are treated to reduce the density of surface state impurities, particularly arsenic released in the oxide layer as a result of forming the oxide layer. The low surface state gallium arsenide channel has very low phase noise and is suitable for use as a local oscillator in a heterodyne receiver.

BRIEF DESCRIPTION OF THE DRAWINGS

Referring to the drawings in which like reference numbers represent corresponding parts throughout:

FIGS. 6A–6D illustrate four embodiments of a GaAs-based device adapted to control excess As;

FIGS. 13A–13I illustrate various fabrication stages of a GaAs GOI MISFET device;

FIG. 16 illustrates a GaAs GOI MISFET device according to the second embodiment for controlling excess As;

FIG. 17 illustrates a GaAs GOI MISFET device according to the third embodiment for controlling excess As;

FIG. 18 illustrates a GaAs GOI MISFET device according to the first embodiment for controlling excess As.

DETAILED DESCRIPTION OF THE PREFERRED EMBODIMENTS

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

One/F (1/F) noise is generated by charge trapping effects due to deep-levels, surface states, defects, dislocations, etc. Studies have shown that the most significant source of charging states occur at the surface of the semiconductor, particularly for gallium arsenide metal-semiconductor FETs (MESFETs) where the channel current flows parallel to the surface. Noise minimization requires that the surface states be de-activated. Standard methods of passivation, however, do not generally work well because the passivation material (nitrides or oxides) do not lattice match the GaAs and stress occurs. The stress creates and increases, rather than reduces, the density of surface states. Also, the electric field near the gate edge of the depletion region in the conduction channel is very high and near the critical field for breakdown. In fact, the MESFET generally operates under large-signal conditions where the gate is free to breakdown for a portion of the RF cycle. This generates gate current which increases the 1/f noise.

A technique for producing a novel surface oxide passivation is presented. The technique has been successfully demonstrated to deactivate surface states. The technique is applied to the fabrication of amplifiers and oscillators having very low 1/f noise.

Oxide Passivation

Figure 1A:
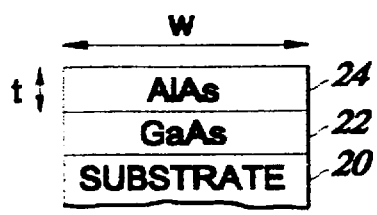
FIGS. 1A–1B illustrate the oxidation of an AlAs layer according to the present invention.
Figure 1B:
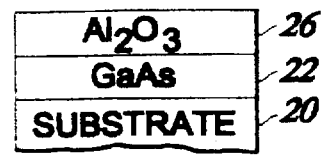

The process of the formation of an oxide layer on top of a layer of gallium arsenide (GaAs) is illustrated in FIGS. 1A and 1B. A substrate 20 is used as a base. The substrate 20 is typically of GaAs, but may also be of other materials. A layer of GaAs 22 is formed on a surface of the substrate 20. A layer of aluminum arsenide (AlAs) 24 is then formed on the GaAs layer 22, FIG. 1A, preferably using an epitaxial method growth process such as molecular beam epitaxy (MBE) or metal-organic chemical vapor deposition (MOCVD). AlAs is selected as the material for the second layer 24 because AlAs is lattice-matched to GaAs and also because AlAs may be converted into an insulating layer in a subsequent step. Since the AlAs material is to be oxidized at a later stage, it may be referred to as an oxidizable layer. Other aluminum-based III-V semiconductor materials having a different anion (Group V atom) may be used in the oxidizable layer instead of AlAs, for example aluminum phosphide (AlP) or aluminum antimonide (AlSb). These other materials are also oxidizable to form $Al_2O_3$.

The layered structure including the AlAs layer 24 is heated to a temperature in excess of 375° C. and exposed to a mixture of nitrogen ($N_2$) gas and water vapor ($H_2O$), as disclosed in U.S. Pat. No. 5,262,360. The gas/vapor mixture is formed by bubbling $N_2$ gas through water at a temperature close to boiling, for example 95° C. The AlAs layer is oxidized according to the reaction:

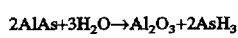

$$2AlAs + 3H_2O \rightarrow Al_2O_3 + 2AsH_3$$

The oxygen in the water molecules of the vapor displaces the arsenic in the AlAs, converting the AlAs layer to an aluminum oxide layer ($Al_2O_3$) 26, as is shown in FIG. 1B. Arsenic (As) is released from Al in the oxidizable layer and combines with hydrogen to form arsine ($AsH_3$) as a byproduct of the oxidation process. The arsine is transported away from the surface by unreacted water vapor and the $N_2$ carrier gas. This oxidation process is termed "wet oxidation."

Two distinct processes are important in oxidation of an Al-bearing III-V layer. First, oxygen replaces the anion (group V element), to oxidize the cation (group III metal). For example, in the case of oxidizing a layer of aluminum arsenide (AlAs), Al is oxidized to become $Al_2O_3$. Therefore, the oxidizing gas should contain oxygen which is available for oxidizing the metal. Second, the group V cation, As, is removed from the oxide layer. In wet oxidization, the As is reduced by the addition of hydrogen to form $AsH_3$ gas, which escapes from the oxide layer. The amount of hydrogen available for binding with As is limited to that amount of hydrogen released by oxygen from the water vapor. In addition, some of the hydrogen may be bound up in the production of $Al(OH)_3$ or $AlO(OH)$. It has been found that the amount of hydrogen released from the water vapor is insufficient to bind with all the As released in oxidation, resulting in significant excess As within the oxide layer after oxidization. The excess As, the interstitial As left within the layer as a result of oxidation, including exposure to water vapor, has a deleterious effect on the underlying GaAs layer due to the formation of surface states at the interface between the oxide and the GaAs layer. The surface As states produce a mid-level (EL-2) impurity in the GaAs layer.

The process of oxidation need not be restricted to exposing the oxidizable layer to a mixture of $N_2$ and $H_2O$, but may also be carried out by using other gas mixtures. For example, oxygen may be provided for the oxidation step by oxygen-bearing molecules (oxidants) other than water, such as oxygen, ozone, carbon dioxide, carbon monoxide, and nitrous oxide.

Likewise, hydrogen may be provided for reducing the interstitial As to arsine by hydrogen-bearing molecules (reducing agents) other than water, such as hydrogen, deuterium, arsine, phosphine, ammonia, antimony hydride, arsine hydride, ammonia hydride, and phosphine hydride. These alternative reducing agents may be cracked to produce free hydrogen which migrates through the oxide layer and combines with the As to neutralize the As. The alternative oxidants and reducing agents may be provided to the AlAs layer either in addition to water vapor or in place of water vapor.

Gaseous $AsH_3$ is included in the list of reduction agents. When the temperature of the semiconductor is sufficiently low (for example, 500° C.) the hydrogen from the cracked $AsH_3$ is able to migrate into the oxide layer and bind up the interstitial As found within the oxide layer as arsine. The free As produced by cracking the arsine is unable to migrate into the oxide layer below 500° C. along with the hydrogen. Thus $AsH_3$ may be used as a source of hydrogen for removing excess As from the oxide layer.

An advantage in providing an alternative gas mixture which includes additional hydrogen is that the relative concentrations of oxygen and hydrogen may be altered in order to optimize the processes of arsenic replacement and of arsenic removal independently of each other.

The AlAs layer 24 is lattice-matched to the underlying GaAs layer 22. However, after oxidation, the $Al_2O_3$ layer 26 has a volume which is around one half of the volume of the original AlAs layer 24, and so the $Al_2O_3$ is not well lattice-matched to the GaAs layer 22, which leads to stress within the semiconductor structure. However, known methods are available for overcoming the problems of induced crystal stress, including the use of ductile materials for relieving the stress, and reduction of the thickness of the $Al_2O_3$ layer, which produces less stress on the underlying GaAs layer.

It has been found that the oxidizing process is most favorably carried out by oxidizing through an edge of the AlAs layer, rather than through a planar surface, advantageously allowing efficient oxidation of a stack of AlAs layers to be carried out. The inventors have shown that the oxidation process is more effective for AlAs layers which are thin, preferably having a thickness, dimension t as shown in FIG. 1A, of less than 10,000 Å and more preferably of less than 1000 Å. The inventors have also shown that the oxidation process is more effective for layers having a width, shown as w in FIG. 1A which preferably is less than 100 μm and which is more preferably less than 1 μm. The width w corresponds to the separation between the source and drain regions in an FET, otherwise known as the gate width.

Figure 3:
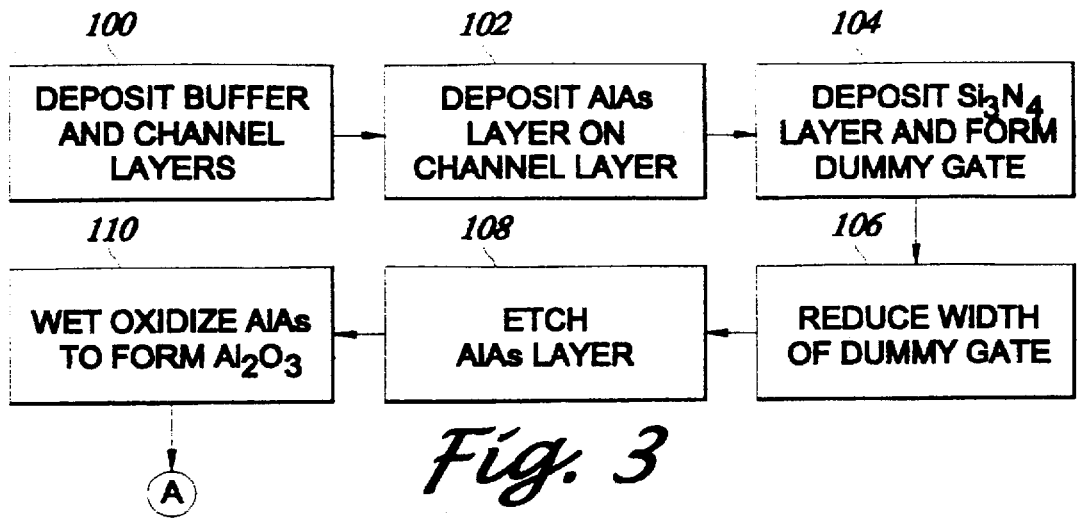
FIGS. 3–5 illustrate method steps in fabricating a GaAs FET.
Figure 4:
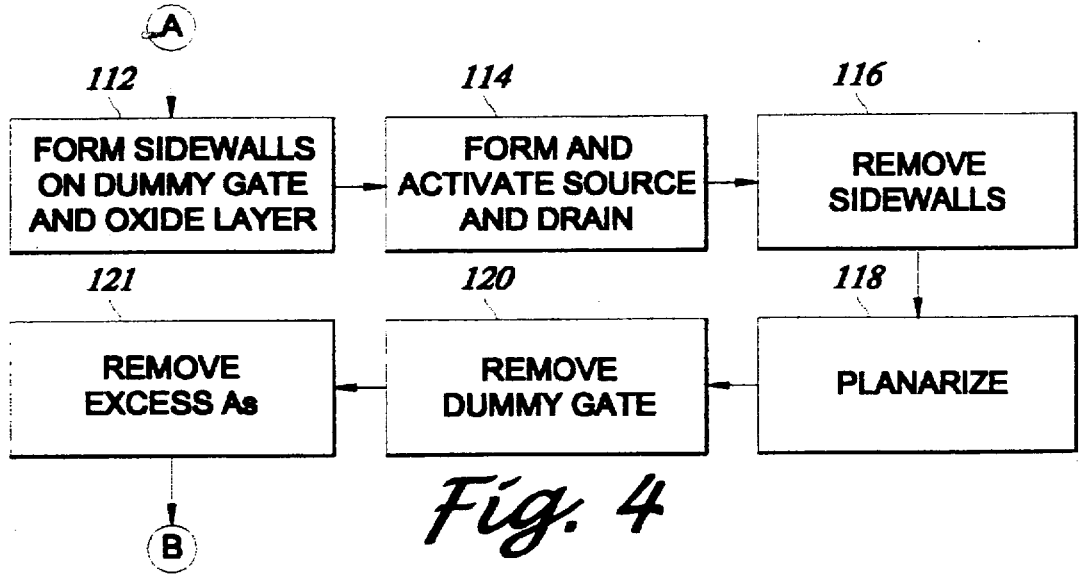
Figure 5:
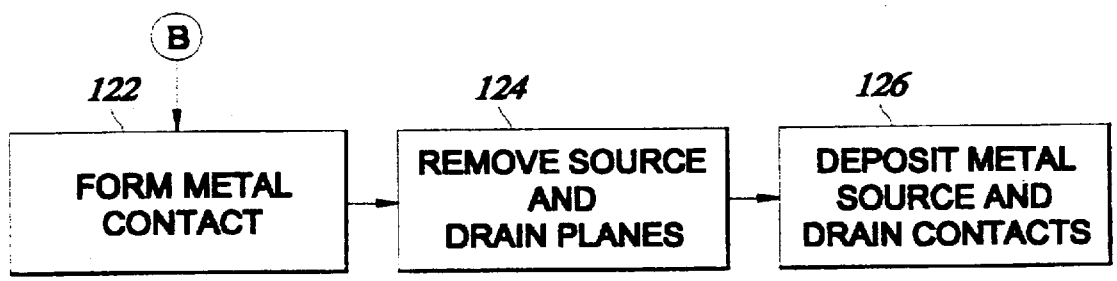

FIG. 2 illustrates sequential fabrication stages for a GaAs-based metal-insulator-semiconductor FET (MISFET), based on the production of an oxide layer according to the process illustrated in FIG. 1. The GaAs MISFET displays logic characteristics similar to logic characteristics of a silicon-based metal-oxide-silicon field effect transistor (MOSFET). Related FIGS. 3–5 illustrate the sequence of procedure steps required to produce the device illustrated in FIG. 2. Without limiting the invention, the fabrication of the various regions in the following MISFET device is described for a doping process using ion implantation. It is understood that doping various regions of the MISFET device, for example the wells and the channels, may also be carried out using other known fabrication processes such as ion diffusion. In addition, layers which are grown, such as the AlAs layer in the following description, may be grown using one of a number of growth methods, including molecular beam epitaxy (MBE), metal-organic chemical vapor deposition (MOCVD), and liquid phase epitaxy (LPE).

During the course of fabrication, masks are formed on the top surface of the structure to shield certain portions of the semiconductor from e.g. the diffusion process or the growth process. The masks are fabricated using photolithography. The process of photolithography entails the deposition of a layer of photosensitive material on the top surface of the semiconductor structure. Certain portions of the photosensitive layer are covered by a photomask and the photomask is exposed to light, forming a latent image of the photomask in the photosensitive layer. The photosensitive layer is chemically developed. After developing, those portions of the photosensitive material which were exposed to the light are removed, typically by washing with water. Those portions of the photosensitive material which were shielded from exposure by the photomask remain on top of the semiconductor structure, and act as a mask for the subsequent processing step. The mask is typically removed by washing with acetone. A further description of the photolithography process may be found in most standard semiconductor textbooks, for instance "Device Electronics for Integrated Circuits" by R. S. Muller and T. I. Kamins, John Wiley, New York, 1977.

Figure 2A:
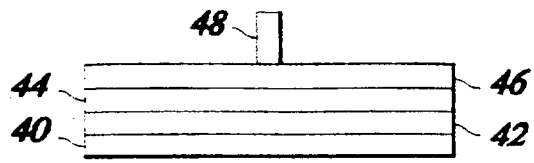
FIGS. 2A–2J illustrate various fabrication stages of a GaAs FET.

An n+ buffer layer 42 is grown on a substrate 40, preferably an n+ GaAs substrate, to produce the structure shown in FIG. 2A. The buffer layer 42 is preferably a layer of GaAs having a thickness of approximately 2000 Å. A channel layer of n– GaAs 44 is grown on the buffer layer 42. The channel layer 44 is preferably doped to a concentration of approximately $10^{17}$ cm$^{-3}$, and preferably has a thickness of approximately 1000 Å. A layer of AlAs 46, preferably having a thickness of approximately 500 Å, is grown on the channel layer 44. A silicon nitride ($Si_3N_4$) layer is then grown on top of the AlAs layer 46. A dummy gate 48 of $Si_3N_4$ is formed on the AlAs layer 46 using a conventional photolithographic process to have a width typically ranging from 1 μm to 0.5 μm. The dummy gate 48 is then preferably reduced in width to approximately 0.2 μm by an etch process, such as plasma etch, reactive ion etch (RIE) or the like, resulting in a gate width that is narrower than the resolution of the photolithographic process.

Figure 2B:
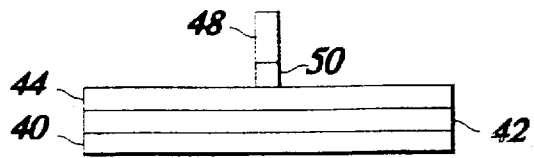
Figure 2C:
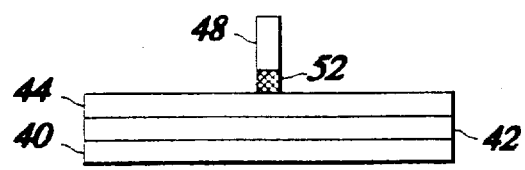
Figure 2D:
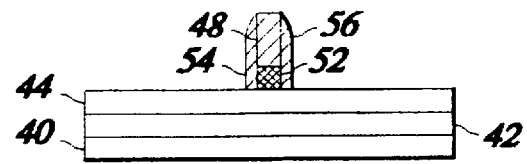

The AlAs layer 46 is etched to remove the AlAs material lying outside the gate region, leaving only a gate portion 50 of AlAs, which is covered by the dummy gate 48, as shown in FIG. 2B. The gate portion 50 is then wet oxidized by exposing the AlAs of the gate portion 50 to water vapor, thus converting the AlAs gate portion 50 to an $Al_2O_3$ gate oxide layer 52, as shown in FIG. 2C.

Next, two $Si_3N_4$ sidewalls 54 and 56 are formed on the gate oxide layer 52 and dummy gate 48, as shown in FIG.

Figure 2E:
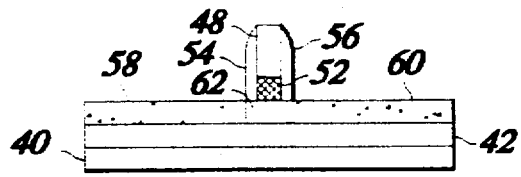

2D. The sidewalls define the self-aligned spacing between the gate and the source/drain of the resulting FET. A source region 58 and a drain region 60 are formed, as shown in FIG. 2E. The source and drain regions 58 and 60 are formed by an ion implantation procedure, but may also be formed by ion diffusion. The ion-bearing source and drain regions are activated after implantation by rapid thermal annealing for 5 min. at 850° C. The thickness of the sidewalls 54 and 56 determine the spacing of the source and drain regions 58 and 60 from the gate oxide layer 52. The dummy gate 48 and gate oxide layer 52 shield a portion of the channel layer 44 from ion implantation, the shielded portion of the channel layer 44 forming a channel region 62.

Figure 2F:
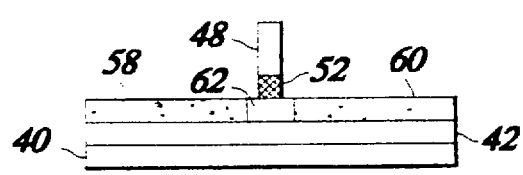
Figure 2G:
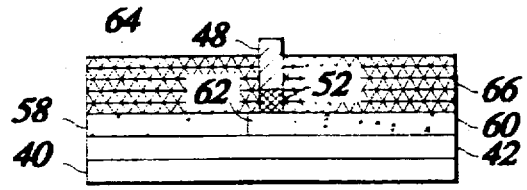
Figure 2H:
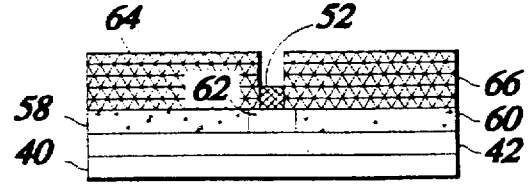
Figure 2I:
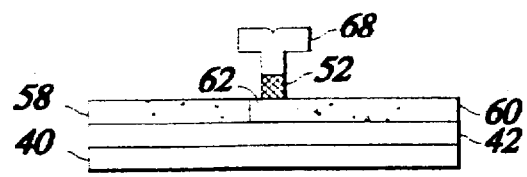
Figure 2J:
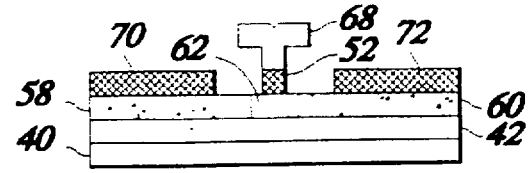

After the ion implantation step, the sidewalls 54 and 56 are removed using RIE or other etching process, as shown in FIG. 2F. The etching process is controlled so as to avoid removing the dummy gate 48. Next, a planarization process, using PMGI, is carried out to produce the structure shown in FIG. 2G, where a source plane 64 and a drain plane 66 are deposited above the source and drain regions 58 and 60 respectively. Once the source and drain planes 64 and 66 are in place, the dummy gate 48 is removed using hydrofluoric acid (HF), as shown in FIG. 2H.

A metal contact 68 is formed on the gate oxide layer 52. Without limiting the invention, it is preferable to reduce the input impedance, that is the input resistance and capacitance, if the MISFET is to be employed as a high frequency power amplifier. A low input impedance may be achieved using a T-shaped metal contact. Thus, a T-shaped contact is formed using the source and drain planes 58 and 60 for forming the head portion of the T-shape. The source and drain planes 64 and 66 are then etched off, resulting in the structure shown in FIG. 2I. Lastly, a metal source contact 70 and a metal drain contact 72 are deposited on the source and drain regions 58 and 60 respectively. A conventional planar metal contact may be deposited on the gate oxide layer 52.

Referring once more to FIGS. 3–5, the steps for manufacturing the GaAs MISFET are now described, with reference to the device fabrication stages shown in FIG. 2. Step 100 describes depositing a buffer layer 42 and a subsequent channel layer 44 on a substrate. Step 102 describes growing an AlAs layer 46 on the channel layer 44. Step 104 describes depositing a $Si_3N_4$ layer on the AlAs layer 46, and forming a dummy gate 48 from the $SI_3N_4$ layer using photolithographic techniques. Step 106 describes reducing the width of the dummy gate 106 using an etching procedure to a width below the resolution of the photolithographic process. Step 108 describes etching the AlAs layer 46, to leave a gate portion 50 of AlAs lying below the dummy gate 48. Step 110 describes wet oxidizing the gate portion 50 of AlAs to produce an $Al_2O_3$ gate oxide layer 52. Step 112 describes forming $Si_3N_4$ sidewalls 54 and 56 on the sides of the dummy gate 48 and the gate oxide layer 52. Step 114 describes forming self-aligned source and drain regions 58 and 60 by ion implantation and activation by rapid thermal annealing or furnace annealing. The source and drain formation described in step 114 also results in the formation of the channel region 62 lying between the source and drain regions 58 and 60. Step 116 describes removing the sidewalls 54 and 56. Step 118 describes planarizing to form source and drain planes 64 and 66. Step 120 describes removing the dummy gate 48 using a hydrofluoric acid etch. Step 121 describes hydrogenizing the oxide layer 52 and the interface between the gate oxide layer 52 and the channel region 62 to remove excess As. Step 122 describes forming a T-shaped metal contact 68 on the gate oxide layer 52, using the source and drain planes 64 and 66 to form the head of the "T". Step 124 describes removing the source and drain planes 64 and 66. Step 126 describes depositing metal contacts 70 and 72 on the source 58 and drain 60 respectively to complete the device.

Control of Excess Arsenic

The oxidation process described hereinabove may not result in the removal of all the arsenic from the AlAs layer. Arsenic may be substantially replaced by oxygen to form $Al_2O_3$. However, some arsenic atoms may not form $AsH_3$ and thence be removed as a gaseous byproduct, but may remain in the oxide layer. The presence of excess As in the oxide layer consequently results in a reduction in the resistivity of the oxide layer by providing a conduction path for carriers through the oxide layer. In addition, the migration of excess As from the oxide layer to the GaAs layer results in the production of a high density of surface states, and may produce $As_{Ga}$ antisites in the underlying GaAs layer. The surface states produce mid-gap (EL-2) type impurity levels which affect the electrical performance of the device, such as the I-V characteristics.

Ideally in a FET device, there is no voltage drop across the gate oxide layer, and the full applied voltage is available for producing the electric field in the channel. The occurrence of a voltage drop across the oxide layer, as may occur due to a reduced oxide layer resistivity or an increased interface state density, increases the voltage which must be applied to the gate in order to achieve a certain channel field and results in increased heating and a reduced device efficiency. Additionally, an increased density of surface states, and concomitant EL-2 levels, has a deleterious effect on the FET channel layer.

It is, therefore, advantageous to reduce the interface state density, and also to avoid reducing the resistivity of the gate oxide layer, by removing excess As from the oxide layer. Excess As removal may be achieved as discussed hereinabove by using alternative oxidation gas mixtures having variable hydrogen proportions, or may be achieved using specific semiconductor device structures. FIGS. 6A–6D illustrate four embodiments of the invention for controlling the excess arsenic in the oxide layer, by either physically removing the excess arsenic from the active layer or by rendering the excess arsenic neutral.

Figures 6A, 6B, 6C, 6D:
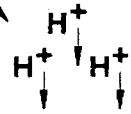

FIG. 6A illustrates a first embodiment of a device structure for removing excess As from the oxide layer, prior to oxidation. The first embodiment makes use of the fact that excess As may effectively be moved under the influence of an electric field, as has been demonstrated by the inventors. The first embodiment includes a 200 Å thick n+ GaAs layer 200 deposited over an original 500 Å AlAs layer 202 which is later oxidized to become an $Al_2O_3$ layer 202' (not shown). The AlAs layer 202, in turn is deposited on top of a p-GaAs layer 204, preferably doped to a level of approximately $3 \times 10^{17}$ $cm^{-3}$. The p-GaAs layer 204 may, for example, be a channel in a FET. The p-GaAs channel layer 204 and the n+ GaAs layer 200 form a p-n junction. The p-GaAs channel layer 204 is deposited on a p+ buffer layer 198, which in turn is deposited on a p+ substrate 196. Since As is an electron donor, the As atoms in the oxide layer 202' have net positive charge and migrate towards the n+ GaAs layer 200, in the direction shown by the arrows, under the influence of the intrinsic electric field of the depletion region of the p-n junction. It is understood that the n+ layer in this embodiment is not restricted to being formed from GaAs, but may also be formed from other semiconductor materials including, but not being limited to, aluminum gallium arsenide (AlGaAs) and indium gallium phosphide (InGaP). Note that this embodiment is useful where the GaAs layer 204 underlying the AlAs layer 202 is doped to be p-type. This embodiment is not useful where the GaAs layer 204 is n-type, since the electric field of a p-n junction having an n-type GaAs layer 204 would result in driving the excess As into the GaAs layer 204, rather than away from the GaAs layer 22.

A second embodiment of the invention for reducing excess As is illustrated in FIG. 6B, including a low temperature grown (LTG) GaAs layer 206 on top of the AlAs layer 202. The AlAs layer 202 is deposited on a layer of n-GaAs 208 which, in turn, is deposited on an n+ buffer layer 194. The n+ buffer layer has been deposited on an n+ substrate 192. LTG GaAs is known to have a large number of Ga vacancies. It is energetically more favorable for As to occupy a Ga vacancy than to remain free as an interstitial. Therefore, after the AlAs layer 202 has been oxidized, the excess As preferably migrates into the LTG GaAs layer 206, in the direction shown by the arrows, to occupy the Ga vacancies. This second embodiment is not restricted to using an LTG GaAs layer. Other materials may be used to form a layer having vacancies, alternatively known as a semiconductor vacancy layer, into which the excess As is attracted.

A third embodiment of the invention for reducing excess As is illustrated in FIG. 6C, which has a GaAs layer 207 deposited above the AlAs layer 202, and a 200 Å layer of a wide gap material 209, preferably AlGaAs or InGaP, positioned between the n-GaAs layer 210, and the AlAs layer 202. It has been found by the inventors that wide gap materials such as AlGaAs and InGaP serve as effective barriers against As migration and, therefore, prevent the migration of excess As into the n-GaAs layer 210 from the oxide layer 202'.

A fourth embodiment of the invention for reducing excess As is shown in FIG. 6D. A layer of AlAs 202 is deposited directly on top of an n-GaAs layer 210. After the AlAs layer 202 has been wet oxidized to produce the oxide layer 202', the oxide layer 202' is then hydrogenated. Hydrogenation is preferably carried out by exposing the oxide layer 202', containing excess As, to a plasma containing hydrogen ions 212. The hydrogenation process also hydrogenates the interface 214 between the oxide layer 202' and the GaAs layer 210. The plasma 212 removes the excess arsenic ions from the oxide layer 202' and the interface 214 by providing excess hydrogen in the oxide layer 202' which combines with the excess As to form arsine gas, $AsH_3$. The arsine gas then migrates out of the oxide layer 202' and is removed. The hydrogen ions in the plasma 212 are preferably accelerated to an energy of 200 electron volts (eV) prior to impacting the oxide layer 202', and the oxide layer is preferably exposed to the plasma for a duration of approximately 15 mins. In addition to vertical hydrogenation, as shown in FIG. 6D where the hydrogen plasma is normally incident on the surface of the $Al_2O_3$ oxide layer, the plasma hydrogenation may also take place through the edge of the oxide layer, in a direction perpendicular to the surface of the $Al_2O_3$ layer. The interface state density is related to the concentration of excess arsenic. By removing excess arsenic in the hydrogenation process, the interface state density is reduced.

Successfully lowering the concentration of excess As in the oxide layer results in improved device properties, such as I-V characteristics, a high electric field in the channel and efficient operation of a FET constructed using an $Al_2O_3$ layer formed on a GaAs layer.

Experimental Results

Figure 7:
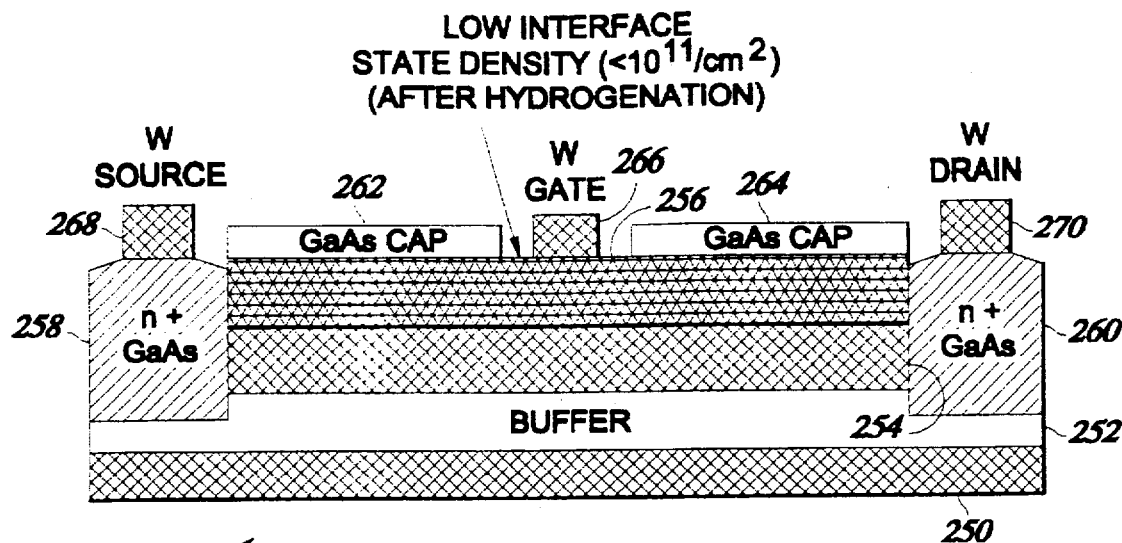
FIG. 7 illustrates the structure of a MISFET fabricated in accordance with the present invention.

Experimental studies have been carried out on a depletion-mode GaAs MISFET 248, whose structure is shown in FIG. 7. The MISFET 248 includes a substrate 250, on top of which is deposited a buffer layer 252. On the buffer layer 252 is a channel region 254 formed from n-GaAs. On the channel region 254 is a layer of $Al_2O_3$ 256, formed on the n-GaAs layer 254 using the wet oxidation process described hereinabove. The oxidation process took place at a temperature of 450° C. in an atmosphere of $N_2$ and $H_2O$ vapor. The MISFET 248 includes n+ GaAs source and drain regions 258 and 260, and has source and drain GaAs caps 262 and 264 over the oxide layer 256 proximate the source and drain regions respectively. The gate electrode 266 and source and drain electrodes 268 and 270 are formed from deposited tungsten (W). The oxide layer 256 was hydrogenated to produce an interface state density of less than $10^{11}$ $cm^{-2}$ at the interface between the oxide layer 256 and the n-GaAs layer 254. Pinch-off of the MISFET 248 requires that the Fermi level move freely through the gap.

Figure 8:
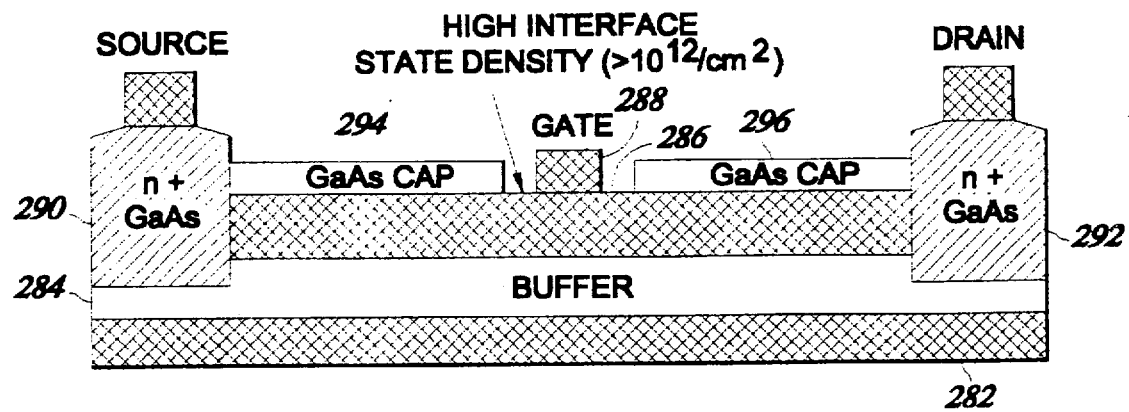
FIG. 8 illustrates the structure of a conventional MESFET.

In FIG. 8 is shown a known metal-semiconductor FET (MESFET) device 280 for comparison with the MISFET 248 of FIG. 7. The MESFET 280 has a substrate 282, upon which are successively deposited a buffer layer 284 and an n-GaAs channel layer 286. A gate electrode 288 is deposited directly on the n-GaAs channel layer 286, and n+ GaAs source and drain regions 290 and 292 are disposed on opposing sides of the gate 288. The device is completed with source and drain GaAs caps 294 and 296 deposited on the n-GaAs channel layer 286. In the MESFET 280, the density of interface states at the interface between the n-GaAs channel layer 286 and the gate electrode 288 is greater than $10^{12}$ $cm^{-2}$, more than a factor of ten higher than for the hydrogenated MISFET 248.

Figure 9:
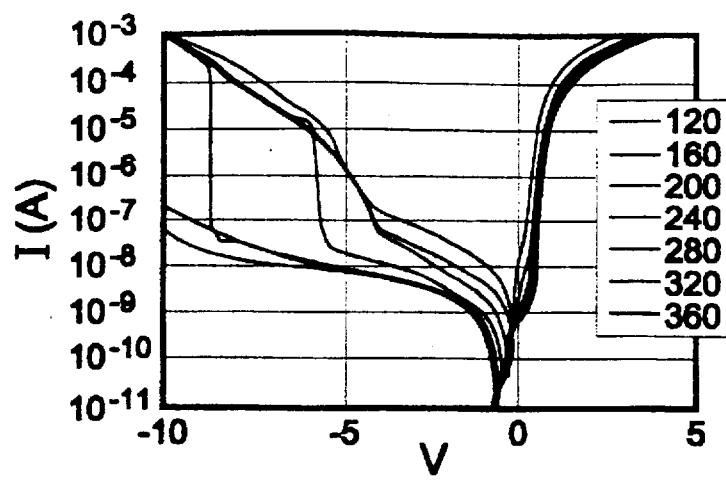
FIGS. 9 and 10 illustrate I-V characteristics for a MISFET having a high density of interface states.
Figure 10:
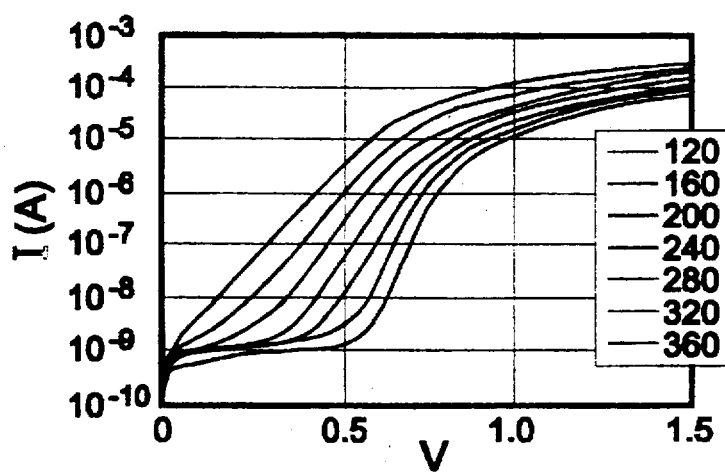

In FIG. 9 is shown the I-V characteristic for a MISFET 248 for a range of temperatures, 120° C. to 360° C., and under biasing conditions of $-10$ V to $+4$ V. In FIG. 10 is shown an expanded view of the I-V characteristic shown in FIG. 9 for the portion of the bias voltage ranging from 0 V to 1.5 V. The MISFET that produced the I-V characteristic illustrated in FIGS. 9 and 10 had an oxide layer which had not been treated for controlling excess arsenic, and so the MISFET had a high interface state density. The high interface state density is reflected in the incomplete pinch-off of the device (the failure to demonstrate zero current under zero bias conditions) and the large hysteresis in the gate-diode breakdown under reverse bias conditions. Both the pinch-off and hysteresis characteristics are illustrated in FIG. 9. An indication of the nature of the interface states is obtained via the forward characteristics shown in FIG. 10, where the carrier transport is probably due to thermionic emission. The barrier height is calculated to be 0.72 eV from the results shown in FIG. 10, which barrier height is nearly identical to the barrier height of W directly deposited on GaAs. This suggests that the Fermi level is pinned at the oxide/GaAs interface by the same defect as at the free GaAs surface, in other words by the $As_{Ga}$ anti-site. Furthermore, the high resistance in the forward diode characteristic suggests that the oxide layer does not act as a tunnel barrier, but rather as a highly resistive ohmic path to the gate diode. The high conductivity of the oxide layer may be caused by unreacted As forming a semi-metallic path in the oxide.

Figure 11:
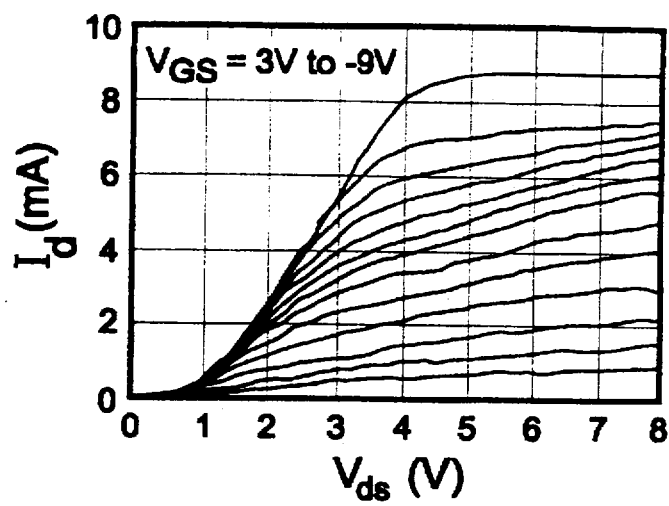
FIG. 11 illustrates I-V characteristics for a MISFET having a low density of interface states prior to hydrogenation of the oxide layer.

The I-V characteristics of a second MISFET, having a lower interface state density than the device used to produce the results of FIGS. 9 and 10, are presented in FIG. 11. This Figure shows drain current, $I_d$, in milliamperes, plotted against the voltage across the source and drain, $V_{ds}$, in Volts, for a number of values of gate-source voltage, $V_{GS}$, ranging from 3 V to $-9$ V. It is seen that the MISFET successfully pinches off at zero bias, unlike the device whose characteristics are shown in FIG. 9. However, $g_m$ compression, a reduction in $\partial I_d/\partial V_{ds}$, is observed near zero gate bias in FIG. 11, indicating the presence of interface states at the corresponding Fermi-level position.

Figure 12:
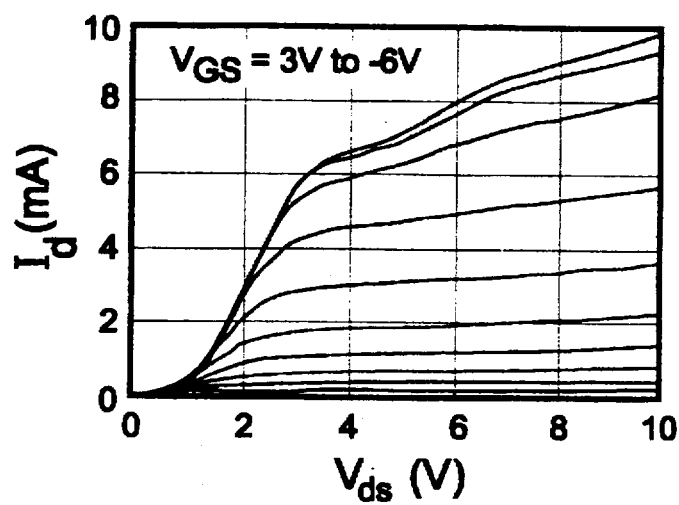
FIG. 12 illustrates I-V characteristics for a MISFET having a low density of interface states after hydrogenation of the oxide layer.

FIG. 12 illustrates the I-V characteristic for the same device whose I-V characteristic is shown in FIG. 11, but where I-V characteristic was measured after the oxide layer had been subjected to room temperature hydrogenation. The room temperature hydrogenation step was carried out by exposing the oxide layer for a duration of 30 minutes to hydrogen ions accelerated to an energy of 500 eV. The inventors have previously shown that this type of hydrogenation treatment is effective at removing As from a GaAs surface in the form of volatile $AsH_3$. The value of $g_m$ ($\partial I_d/\partial V_{ds}$) for this device is higher than for the device whose characteristic is shown in FIG. 11. In addition, the gate diode characteristic shows a weak temperature dependence, which is indicative of tunneling transport and not of thermionic emission.

The results of these experiments illustrate that, with controlled oxidation and subsequent treatment to reduce excess residual As, an $Al_2O_3$ layer suitable for use as a gate insulator for a FET can be obtained.

Low Noise GaAs FETs

Figure 19:
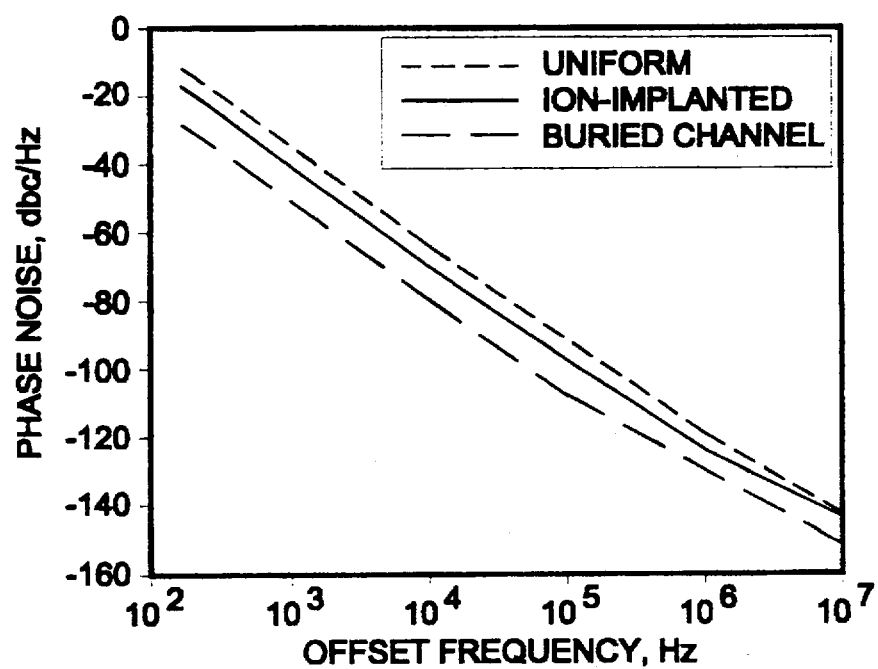
FIG. 19 illustrates noise power as a function of offset frequency for an FET having channels of different doping profiles.

The geometry and design of a FET are extremely important in determining the noise performance of the device. The device is preferably designed so that the electric field in the channel layer is reduced to be low. This is accomplished by maximizing the length of the channel, rather than reducing it as is done to achieve a low noise figure. The device is preferably operated as close to its upper frequency limit as possible. Also, the channel is preferably wide, allowing the device to operate at a reduced current density, which minimizes the effect of traps. Most significant, however, is the channel doping profile. The doping profile is preferably selected to minimize the device transfer characteristic nonlinearity, specifically the input capacitance. Modulation of this parameter by the baseband noise results in the upconversion of the baseband noise to the RF oscillation. The effect of doping profile is shown in FIG. 19, which illustrates the calculated phase noise as a function of offset frequency for three GaAs MESFET oscillators having channels with uniformly doped, ion-implanted, and buried channel doping profiles. The phase noise was calculated for each of the three device models using a device/circuit simulator.

The buried channel profile is shown to have the lowest 1/f noise. This is attributed to the linearization of the reactive (imaginary) part of the input impedance which, therefore, reduces the coupling mechanism for upconverting phase noise to the operating frequency. The buried channel device is modelled to have a low doped layer between the gate metal and the highly conducting channel. In operation, the gate depletion layer extends throughout the low doped region and is pegged at the high doped layer. The capacitance of the device is therefore nearly constant. Since the nonlinearity of the input capacitance is reduced, upconversion of phase noise to the operating frequency is reduced, and the device with the buried channel thus demonstrates superior noise characteristics over other channel designs.

GaAs FET structures where the GaAs channel is sandwiched between $Al_2O_3$ layers may be fabricated. The $Al_2O_3$ layers may be further treated to reduce the excess As and, therefore, reduce surface state density. The fact that the channel is buried reduces the nonlinearity of the input capacitance. Thus, a device may advantageously be fabricated which includes important features for reducing phase noise. Since the channel layer of GaAs lies above an insulating oxide layer, the device is termed a GaAs-on-insulator (GOI) metal-insulator-semiconductor FET (MISFET).

Figure 14:
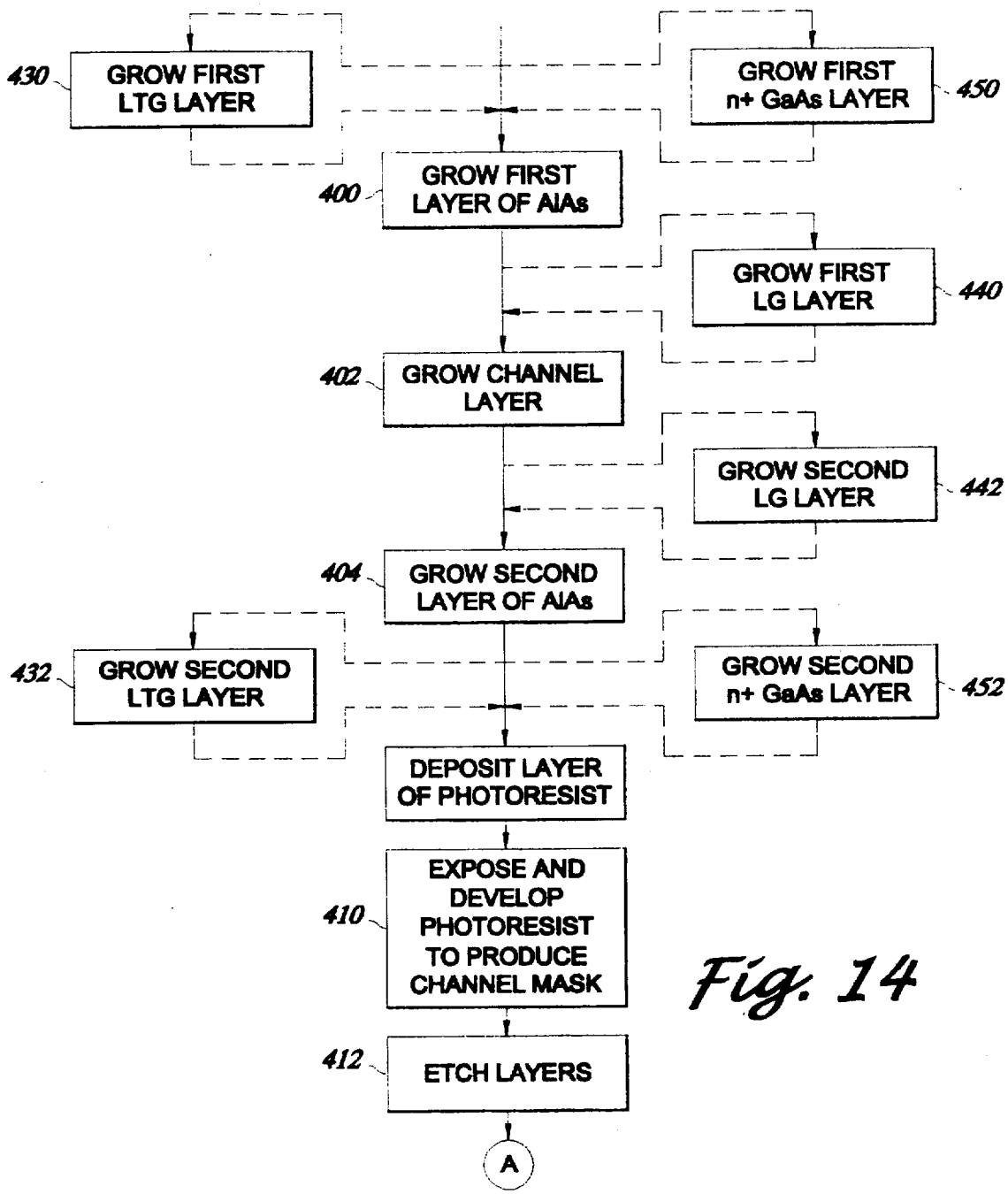
FIGS. 14 and 15 illustrate various method steps for fabricating a GaAs GOI MISFET device.
Figure 15:
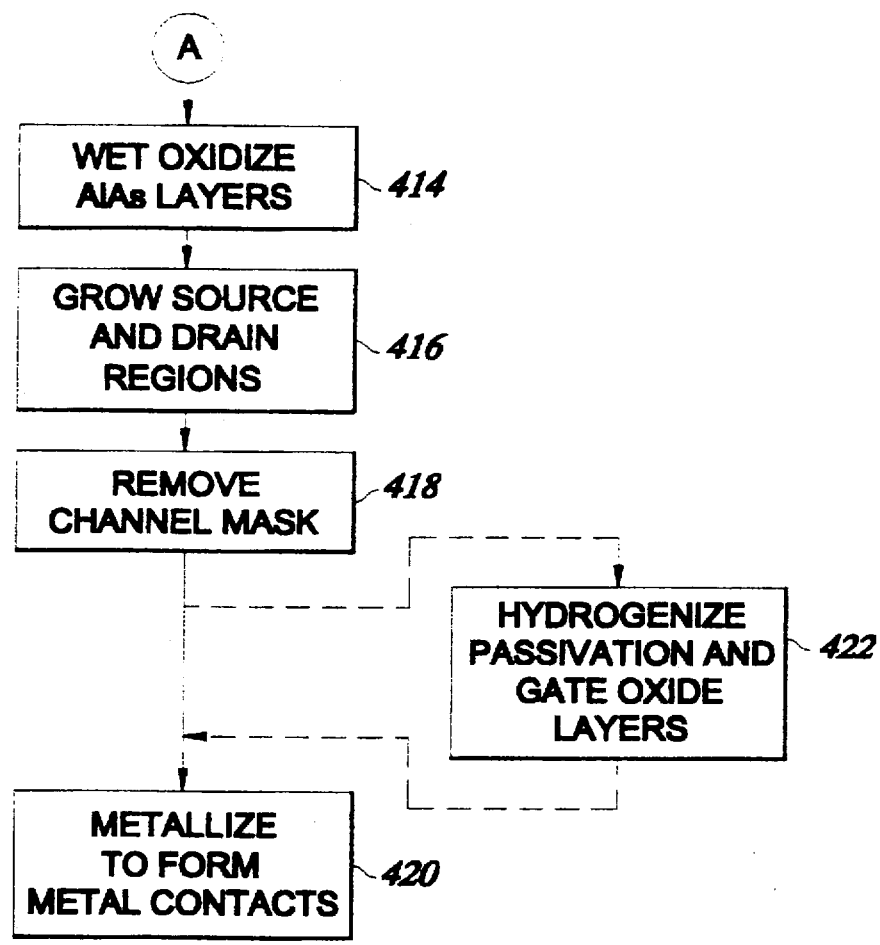

FIG. 13 illustrates various fabrication stages of a depletion mode GOI MISFET based on an n-GaAs channel. A P-GaAs GOI MISFET may be fabricated using similar steps, except for the substitution of p-type impurities for the n-type impurities. FIGS. 14–15 illustrate the various fabrication steps associated with fabricating the device shown in FIG. 13. Without limiting the invention, the fabrication (doping) of the various regions in the following GOI device is described for a fabrication process using ion diffusion. It is understood that the fabrication of various regions of the GOI MISFET, for example source and drain, may also be carried out using other known fabrication processes such as ion implantation. In addition, the growth of layers in the following description, such as the AlAs and GaAs layers, may take place through the use of one of a number of known growth methods, including MBE, MOCVD, and liquid phase epitaxy (LPE). The channel mask and metallization mask referred to below are typically formed using a conventional lithographic process.

Figure 13A:
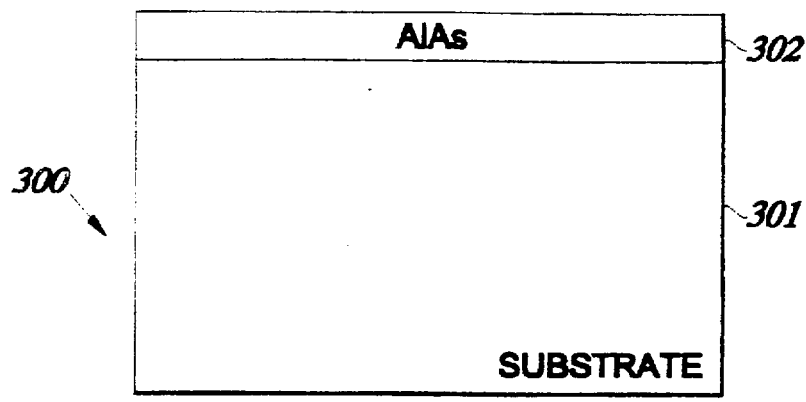

In FIG. 13A is shown a semiconductor structure 300 which includes a substrate 301, preferably of n-type GaAs, on which has been grown, a first layer of AlAs 302, preferably having a thickness ranging from 300 Å to 1000 Å. A channel layer of n-GaAs 304 is grown on the first layer of AlAs 302, the channel layer 304 preferably having a thickness ranging from 500 Å to 2000 Å. A second layer of AlAs 306 is grown on the channel layer 304, also having a thickness ranging from 300 Å to 1000 Å, to produce the structure shown in FIG. 13B.

Figure 13C:
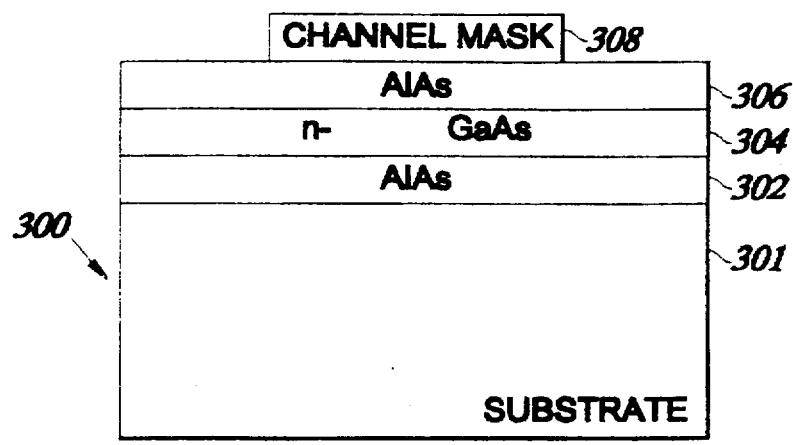
Figure 13B:
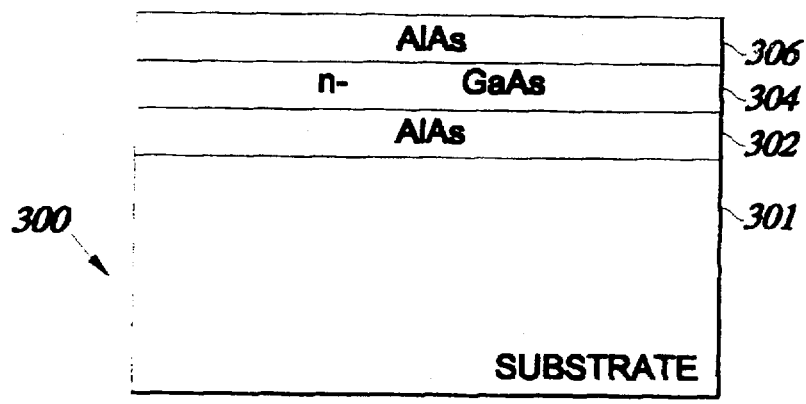
Figure 13D:
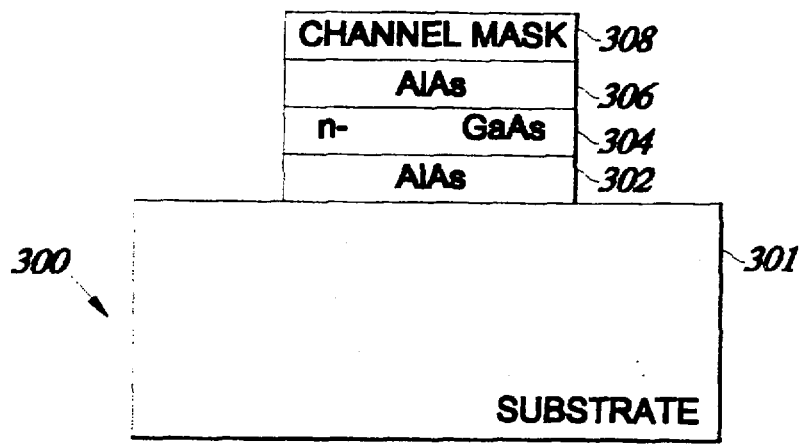
Figure 13E:
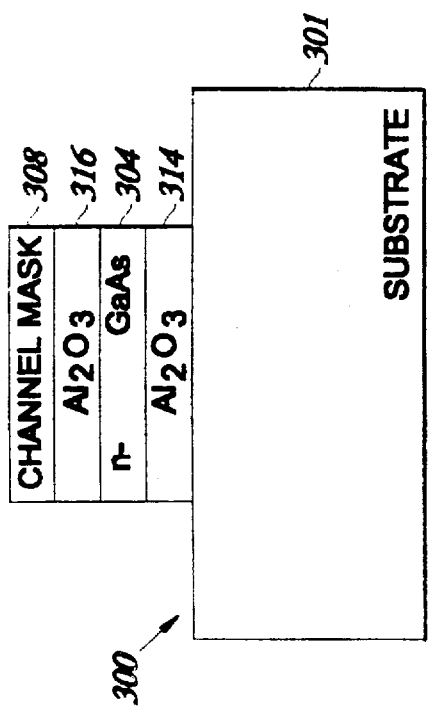
Figure 13F:
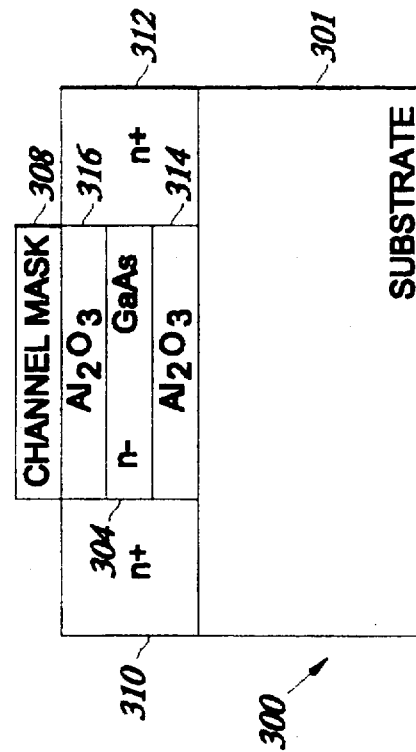

A layer of photoresist is then laid on top of the second AlAs layer 306, and then exposed and developed to produce the channel mask 308 shown in FIG. 13C. The channel mask 308 exposes those areas of the structure 300 which are not to be formed into channels. The AlAs and GaAs layers 302, 304, and 306 are then etched, preferably using a reactive ion etch method (RIE), leaving only those portions of the layers 302, 304, and 306 which were protected by the channel mask 308, to produce the structure shown on FIG. 13D.

The first and second layers of AlAs 302 and 306 are then exposed to the wet oxidation process, to convert the AlAs to $Al_2O_3$. The first AlAs layer 302 is converted to a passivation layer 314 underlying the n-channel 304, and the second AlAs layer 306 is converted to a gate oxide layer 316, to produce the structure shown in FIG. 13E. An n+ source region 310 and an n+ drain region 312 are then grown, in place of the portions of the layers 302, 304 and 306 which were previously etched off, resulting in the FET-type structure shown in FIG. 13F. Note that, unlike conventional FET structures, the channel region 304 in this case is sandwiched between the passivation layer and the gate oxide layer.

Figure 13G:
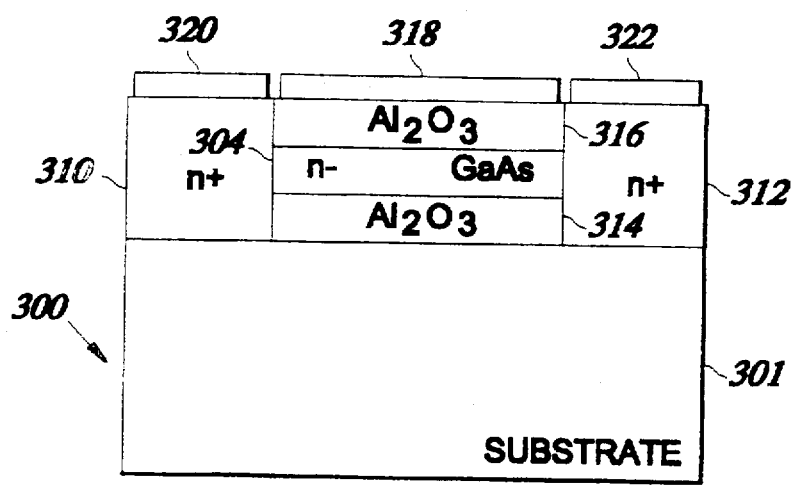

The channel mask 308 is then removed, and the GOI MISFET device 300 is completed by following a conventional metallization step to form a gate electrode 318 on the gate oxide layer 316, a source electrode 320 on the n+ source 310 and a drain electrode on the n+ drain 312, as shown in FIG. 13G.

Referring once more to FIGS. 14 and 15, step 400 describes growing the first layer of AlAs 302 on the substrate 301. Step 402 describes growing the n-GaAs channel layer 304 on the first AlAs layer 302. Step 404 describes growing the second layer of AlAs 306 on the channel layer 304. Step 408 describes depositing a layer of photoresist on the second layer of AlAs 306. Step 410 describes exposing and developing the photoresist layer to form the channel mask 308. Step 412 describes etching the first and second AlAs layers 302 and 306 and the channel layer 304. Step 414 describes wet oxidizing the first and second AlAs layers 302 and 306 to become the passivation layer 314 and the gate oxide layer 316 respectively. Step 416 describes growing the source region 310 and the drain region 312. Step 418 describes removing the channel mask 308, preferably with acetone. Step 420 describes metallizing to form metal contacts for the gate electrode 318, source electrode 320 and drain electrode 322.

Other steps may be included in the fabrication process for the GOI MISFET device 300 in order to control excess As according to the methods discussed hereinabove with respect to FIGS. 6A–6D. For example, the $Al_2O_3$ passivation layer 314 and gate oxide layer 316 may be hydrogenated prior to metallization, step 422, by exposing the layers 314 and 316 to a hydrogen plasma as discussed hereinabove. The inventors have shown that an $Al_2O_3$ layer which is not the surface layer in a stack of semiconductor layers may be successfully hydrogenated with the hydrogen plasma process. The dashed lines in FIGS. 14–15 indicate alternate paths in the method steps to include control of the excess As created in the $Al_2O_3$ layers as a result of the oxidization process.

Figure 16:
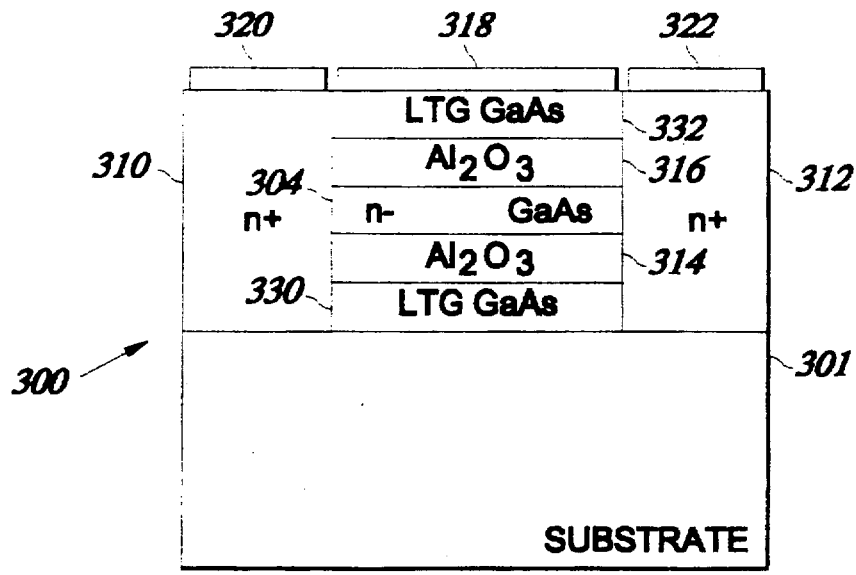

Alternatively, following the second embodiment shown in FIG. 6B, a first low temperature growth (LTG) GaAs layer 330 may be grown below the first AlAs layer 302, step 430, prior to the growth of the first AlAs layer 302, and a second LTG GaAs layer 332 may be grown on top of the second AlAs layer 306, step 432, prior to forming the channel mask 308 on the uppermost layer. The LTG GaAs layers each have a thickness ranging from 10 Å to 10,000 Å. After the oxidization and metallization steps, the resulting structure would be as shown in FIG. 16. This structure is similar to that shown in FIG. 13G, but includes LTG GaAs layers 330 and 332 below the passivation layer 314 and above the gate oxide layer 332 respectively. The LTG GaAs layers 330 and 332 attract excess As out of the passivation layer 314 and gate oxide layer 316 respectively, removing As from the vicinity of the channel region 304.

Figure 17:
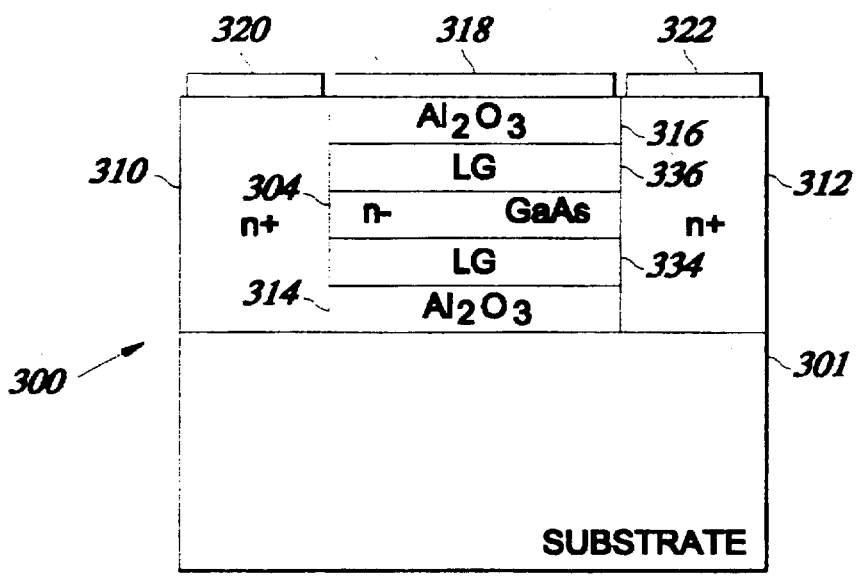

In accordance with the third embodiment as shown in FIG. 6C, a first layer of a large gap (LG) material 334, such as AlGaAs or InGaP may be grown on the structure 300, step 440, after growing the first AlAs layer 302, and a second LG layer 336 may be grown on the n-channel layer 304, step 442, prior to growing the second AlAs layer 306. The subsequent etching step, step 444, would remove unwanted portions of both the LG layers 334 and 336. The process would then continue as discussed above, to produce the structure shown in FIG. 17, which is similar to that of FIG. 13G, but includes thin layers of LG material 334 and 336 between the passivation layer 314 and the channel region 304, and the channel region 304 and the gate oxide layer 316 respectively, for blocking the migration of excess As into the channel region 304.

Figure 18:
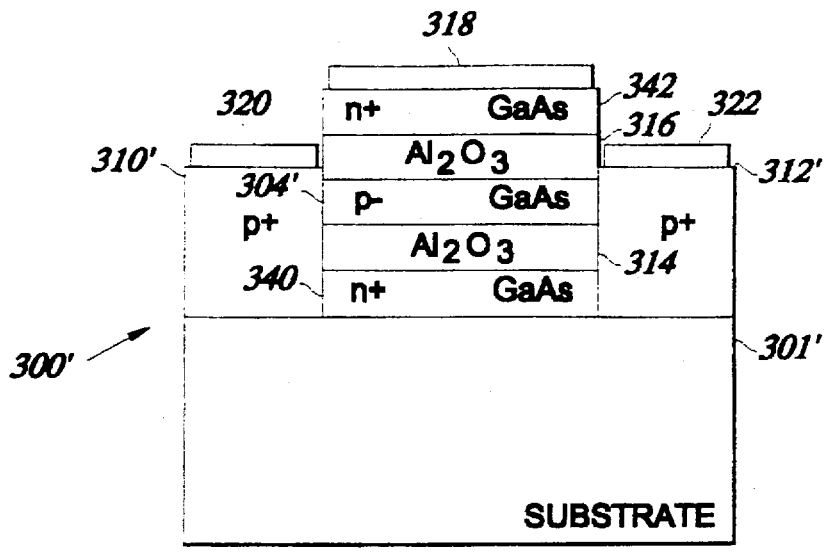

In accordance with the first embodiment as shown in FIG. 6A, a structure 300' is grown, preferably from a p– substrate, which uses a p– channel region 304'. Since the structure 300' employs a p– channel, n+ layers may be grown for attracting excess As out of the $Al_2O_3$ layers. The process of fabricating the structure 300' shown in FIG. 18 is substantially the same as process as is used to fabricate structure 300 shown in FIG. 13G, except that p– material is used in the place of n– material, and p+ material is used instead of the n+ material. The method of fabricating the structure shown in FIG. 18 is largely similar to the method described above in regard to FIGS. 14 and 15, for the following. A first layer of n+ GaAs 340 is grown, step 450, below the first layer of AlAs 302. A second layer of n+ GaAs 342 is grown, step 452, on the second layer of AlAs 306. In step 414 where the source and drain regions 310' and 312' are grown, the growth process is terminated before the source 310' and drain 312' reach the level of the second n+ GaAs layer 342. This prevents the second n+ GaAs layer from contacting the source 310' and 312'. A transistor would be formed if contact were made between the n+ GaAs layer 342 and the source 310' and drain 312', which would adversely affect the operation of the GOI MISFET using the p– channel region 304'.

In summary, a method of forming an insulating layer on a GaAs layer has been described which enables the fabrication of GaAs-based field effect devices. Methods of forming the layer have been described, along with device configurations which are useful to remove excess arsenic from an oxide layer and thus better control the electrical properties of the semiconductor device by reducing surface state density. Because of these methods, a GaAs-based field effect transistor can be fabricated, which includes a channel layer sandwiched between a passivation layer and a gate oxide layer (GOI MISFET). The reduction in the surface state density in this device is advantageous for reducing the phase noise. Consequently, the GOI MISFET is well adapted for use as a local oscillator in heterodyne receivers.

The foregoing description of the preferred embodiment of the invention has been presented for the purposes of illustration and description. It is not intended to be exhaustive or to limit the invention to the precise form disclosed. Many modifications and variations are possible in light of the above teaching. For example, the discussion has been in terms of a field effect transistor, but the invention is also applicable to other semiconductor devices, such as diodes and the like. The invention is also applicable to semiconductor devices based on other materials, including III-V compounds and Group IV semiconductors. It is intended that the scope of the invention be limited not by this detailed description, but rather by the claims appended hereto.

What is claimed is:

1. A field effect semiconductor device, comprising:
   an aluminum oxide passivation layer;
   a channel region deposited over the passivation layer; and
   an aluminum oxide gate oxide layer formed over the channel region.

2. The device of claim 1, wherein the channel region is formed from gallium arsenide.

3. The device of claim 1, further comprising a controlling layer in contact with the passivation layer for controlling excess arsenic atoms in the passivation layer.

4. The device of claim 3, wherein the controlling layer comprises an n-type layer deposited below the passivation layer.

5. The device of claim 4, wherein the n-type layer is formed from the group consisting of gallium arsenide and aluminum gallium arsenide.

6. The device of claim 3, wherein the controlling layer comprises a vacancy semiconductor layer deposited under the first layer of aluminum arsenide, the vacancy semiconductor layer having vacancies so as to attract the excess arsenic from the passivation layer.

7. The device of claim 6, wherein the vacancy semiconductor layer comprises a low temperature growth layer of gallium arsenide deposited below the passivation layer.

8. The device of claim 3, wherein the controlling layer comprises a semiconductor barrier layer deposited between the passivation layer and the channel region so as to prevent the excess arsenic atoms from migrating into the channel region.

9. The device of claim 8, wherein the semiconductor barrier layer is formed from the group consisting of aluminum gallium arsenide and indium gallium phosphide.

10. The device of claim 1, further comprising a controlling layer in contact with the gate oxide layer for controlling excess arsenic atoms in the aluminum oxide gate layer.

11. The device of claim 10, wherein the controlling layer comprises an n-type layer deposited over the gate oxide layer.

12. The device of claim 11, wherein the n-type layer is formed from the group consisting of gallium arsenide and aluminum gallium arsenide.

13. The device of claim 10, wherein the controlling layer comprises a vacancy semiconductor layer deposited over the second layer of aluminum arsenide, the vacancy semiconductor layer having vacancies so as to attract the excess arsenic from the gate oxide layer.

14. The device of claim 13, wherein the vacancy semiconductor layer comprises a low temperature growth layer of gallium arsenide deposited over the gate oxide layer.

15. The device of claim 10, wherein the controlling layer comprises a semiconductor barrier layer deposited between the channel region and the gate oxide layer so as to prevent the excess arsenic atoms from migrating into the channel region.

16. The device of claim 15, wherein the semiconductor barrier layer is formed from the group consisting of aluminum gallium arsenide and indium gallium phosphide.

17. A gallium arsenide field effect transistor, comprising:
a hydrogenated aluminum oxide passivation layer;
a gallium arsenide channel region deposited over the hydrogenated aluminum oxide passivation layer; and
source and drain regions.

18. The transistor of claim 17, further comprising a hydrogenated aluminum oxide gate layer formed over the gallium arsenide channel region from a second aluminum arsenide layer.

19. A gallium arsenide field effect transistor, comprising:
a substrate;
an aluminum oxide passivation layer formed over the substrate;
a gallium arsenide channel region overlying the passivation layer;
an aluminum oxide gate oxide layer overlying the channel region;
source and drain regions respectively disposed at opposite sides of, and each in electrical contact with, the channel region; and
individual metallized electrical contacts on each of the gate oxide layer, the source region and the drain region.

20. The transistor of claim 19, further comprising a first n-type semiconductor layer underlying the passivation layer and a second n-type semiconductor layer overlying the gate oxide layer.

21. The transistor of claim 19, wherein the transistor further comprises a first semiconductor vacancy layer underlying the passivation layer and a second semiconductor vacancy layer overlying the gate oxide layer.

22. The transistor of claim 19, wherein the transistor further comprises a first semiconductor barrier layer deposited between the passivation layer and the channel region and a second semiconductor barrier deposited between the channel region and the gate oxide layer so as to prevent excess arsenic atoms from migrating into the channel region.

23. The transistor of claim 19, wherein the passivation layer and the gate oxide layer are both composed of hydrogenated aluminum oxide.

24. A field effect transistor having a source and a drain, manufactured by a method comprising the steps of:
forming a first layer of aluminum arsenide;
depositing a channel layer of gallium arsenide over the first layer of aluminum arsenide; and
oxidizing the first layer of aluminum arsenide to create a passivation layer of aluminum oxide.

25. A field effect transistor, manufactured by a method comprising the steps of:
depositing a first layer of aluminum arsenide;
depositing a channel layer of gallium arsenide over the first layer of aluminum arsenide;
depositing a second layer of aluminum arsenide over the channel layer of gallium arsenide; and
oxidizing the first and second layers of aluminum arsenide to create a passivation layer of aluminum oxide and a gate oxide layer of aluminum oxide respectively.

* * * * *